(12) United States Patent
Sung

(10) Patent No.: US 6,352,897 B1
(45) Date of Patent: Mar. 5, 2002

(54) METHOD OF IMPROVING EDGE RECESS PROBLEM OF SHALLOW TRENCH ISOLATION

(75) Inventor: Kuo-Tung Sung, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/329,111

(22) Filed: Jun. 9, 1999

(51) Int. Cl.[7] .................. H01L 21/336; H01L 21/76
(52) U.S. Cl. .................. 438/296; 438/404; 438/424
(58) Field of Search .................. 438/296, 404, 438/424

(56) References Cited

U.S. PATENT DOCUMENTS

| 5,118,641 A | * | 6/1992 | Roberts |
| 5,393,694 A | * | 2/1995 | Mathews |
| 5,672,538 A | * | 9/1997 | Liaw et al. |
| 5,686,346 A | * | 11/1997 | Duane |
| 5,956,598 A | * | 9/1999 | Huang et al. |
| 6,110,796 A | * | 8/2000 | Sung |
| 6,140,216 A | * | 10/2000 | Richart et al. |
| 6,245,637 B1 | * | 6/2001 | Tsai |

* cited by examiner

Primary Examiner—John F. Niebling
Assistant Examiner—Josetta I. Jones
(74) Attorney, Agent, or Firm—J. C. Patents

(57) ABSTRACT

A method for improving an edge recess of a shallow trench isolation (STI). A $SiO_x$ layer with gap-filling ability is formed to fill the edge recess at the top corner of the STI. A part of the $SiO_x$ layer on the substrate is then removed, leaving a part of the $SiO_x$ layer to fill the edge recess and to cover a sidewall of the substrate at the edge.

10 Claims, 4 Drawing Sheets

METHOD OF IMPROVING EDGE RECESS PROBLEM OF SHALLOW TRENCH ISOLATION

BACKGROUND OF THE INVENTION

1. Field of the Invention

The invention relates to a method of fabricating a semiconductor device. More particularly, the invention relates to a method for improving the edge recess problem of a shallow trench isolation (STI) structure.

2. Description of the Related Art

An integrated circuit (IC) is composed of many devices and isolation structures that isolate the devices. The isolation structures, such as STI structure or field oxide isolation structure, are used to prevent carriers from moving between devices. Conventionally, the isolation structures are formed within a concentrated semiconductor circuit, for example, between adjacent field effect transistors (FET) in a dynamic random access memory (DRAM), to reduce a current leakage produced by the FET.

In the booming development of the IC, it has become necessary to minimize and integrate the device. As the size of the device is scaled down with an increased integration, the isolation structure between the devices also needs to be scaled down. Of the many different methods to isolate the devices, a scalable STI is a better isolation technology for the deep sub-micron complementary metal oxide semiconductor (CMOS) process.

STI is an isolation method that forms a trench in the substrate by anisotropic etching and subsequently filling the trench with a $SiO_x$ layer in order to complete the isolation of the devices.

FIG. 1A and FIG. 1B are schematic cross-sectional views showing the process flow of STI fabrication in the prior art.

Referring to FIG. 1A, a patterned pad oxide layer 102 and $SiN_x$ layer 104 are formed on a substrate 100. With the pad oxide layer 102 and the $SiN_x$ layer 104 serving as the mask, etching is performed to form a trench 106 in the substrate 100, so that a part of the substrate 100 is exposed. A liner oxide layer is formed by thermal oxidation on the substrate surface in the trench 106, followed by forming a $SiO_x$ layer 110 that fills the trench 106 and covers the exposed substrate 100 as well as the $SiN_x$ layer 104.

Referring to FIG. 1B, chemical mechanical polishing (CMP) is performed with the $SiN_x$ layer 104 acting as an etching stop to remove the excess $SiO_x$ layer 110, so that the $SiO_x$ layer 110 remains in the trench 106 only. The $SiN_x$ layer 104 is removed by etching while the pad oxide layer 102 is removed by a HF solution, leaving the $SiO_x$ layer 110a in the trench 106 to form a STI structure.

In the STI process described above, the $SiO_x$ layer 110a and the liner oxide layer 108 are formed in the trench 106. During the wet etching process which etch the pad oxide layer 102 with a HF solution, a recess 116 is formed on a top corner 114 of the STI 112 due to isotropic over-etching with the HF solution. Subsequently, the thickness of the gate oxide layer formed at the top corner 114 is thinner than the gate oxide layer formed on the active region (not shown), leading to a kink effect which causes a MOS transistor to produce a sub-threshold leakage. Furthermore, the depth of the recess 116 can be deepened with frequent use of the HF solution during the removal process of the multiple $SiO_x$ layer, such as removal of the sacrificial oxide layer, the tunnel oxide in the flash memory, and the dielectric layer (ONO layer) in the capacitor.

When the self-aligned silicide (salicide) process is performed on the STI with the recess structure, not only is the metal silicide layer formed in the adjacent source/drain region (not shown), but it also extends to a part of sidewall 118 of the substrate 100 (shown in FIG. 1A) exposed by the edge recess 116 of the STI. This causes the sidewall 118 of the substrate 100 to become a conducting layer, thus a serious junction leakage of the current occurs if the depth of the recess 116 exceeds the junction depth of the source/drain region.

As the STI with the recess is applied in a borderless contact, a Ti layer (glue layer) at the bottom of the borderless contact is adjacent to the exposed sidewall of the substrate 118 because the borderless contact is formed at the edge between the source/drain region and the STI. This leads to junction leakage of the current.

SUMMARY OF THE INVENTION

The invention provides a method to improve the edge recess of the STI. A substrate comprises of a STI with a recessed top corner, which exposes a part of a sidewall of the substrate. An insulating layer having a gap-filling capability is formed to cover the substrate and to fill the edge recess at the top corner. A part of the insulating layer over the substrate is removed, leaving a remaining part of the insulating layer to fill the edge recess and to cover the exposed sidewall of the substrate. The self-aligned metal silicide (salicide) process or borderless contact process is then performed.

As the exposed sidewall surface of the substrate is covered by the insulating layer in the edge recess, the junction leakage problem caused by applying the subsequent metallization to expose the sidewall of the substrate in the edge recess is improved.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

First Embodiment

Figure 1A:
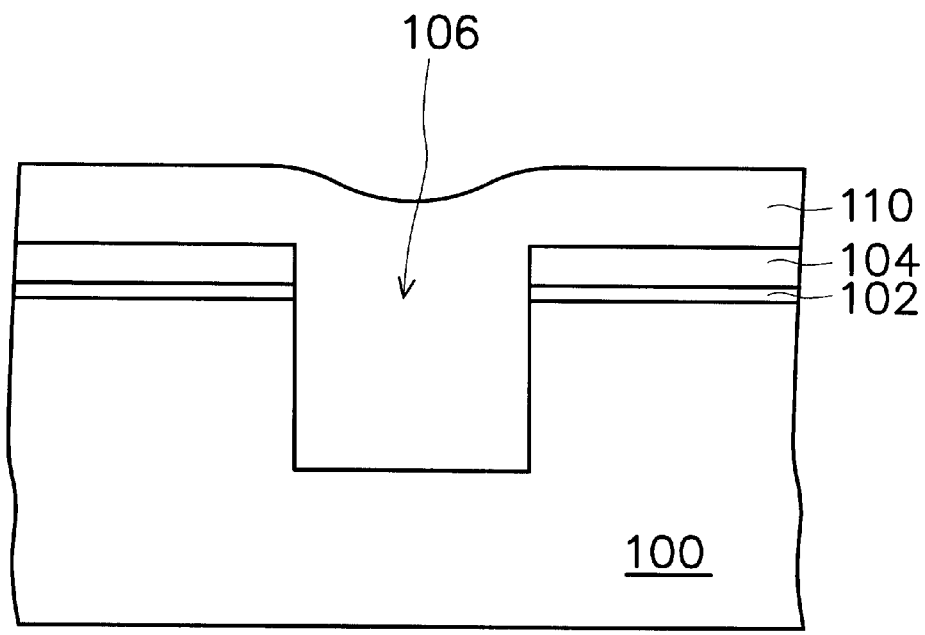
FIGS. 1A to 1B are schematic, cross-sectional views showing the process flow of STI fabrication in the prior art.
Figure 1B:
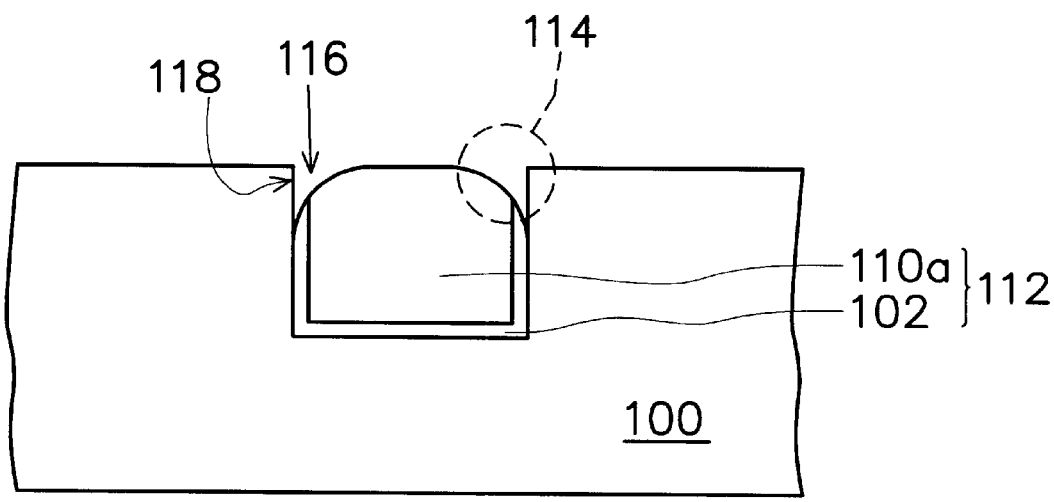
Figure 2A:
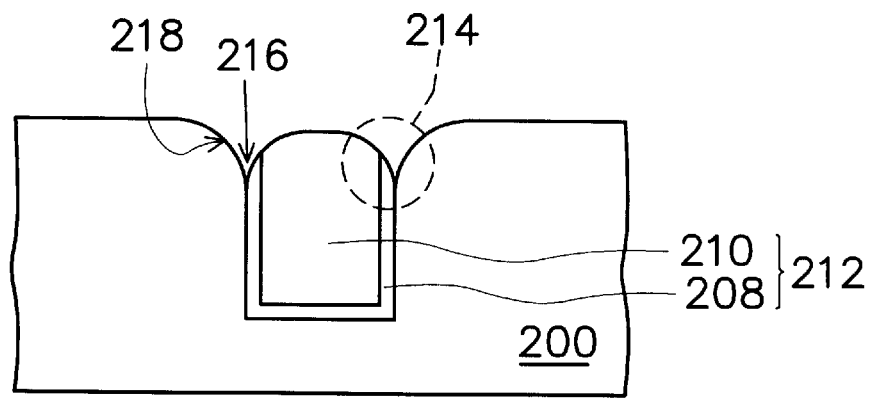
FIGS. 2A to 2C are schematic, cross-sectional views showing the process flow of STI fabrication according to the first embodiment of the present invention.
Figure 2B:
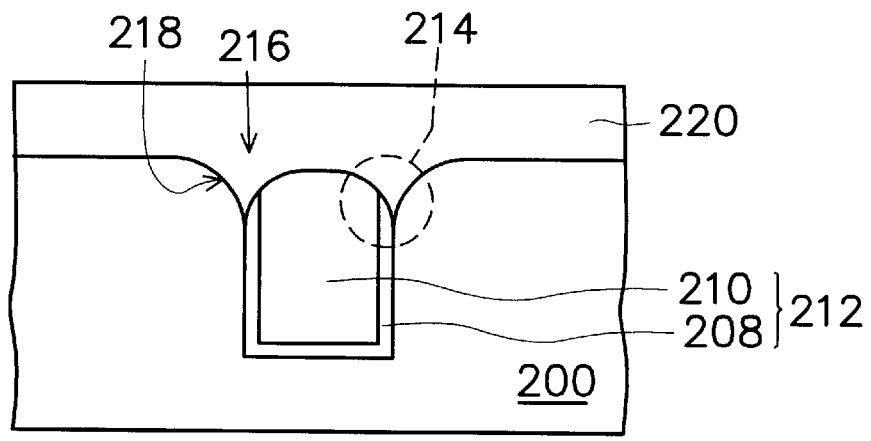
Figure 2C:
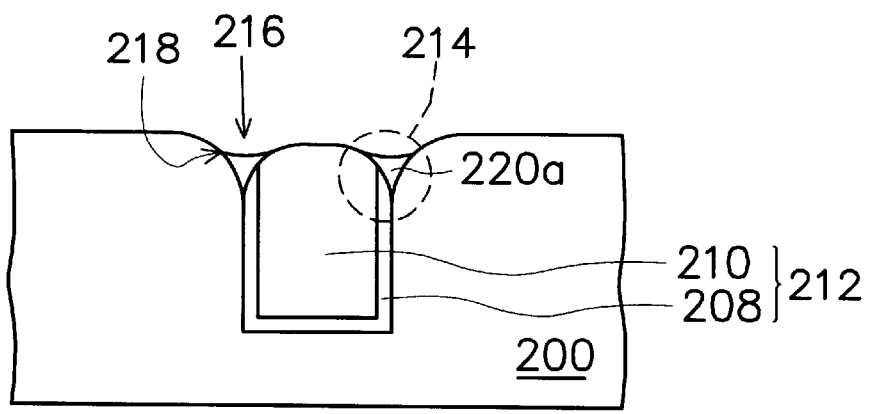

FIGS. 2A to 2C are schematic, cross-sectional views showing the process flow of STI fabrication according to the first embodiment of the present invention.

Referring to FIG. 2A, a semiconductor substrate 200 is provided, wherein the substrate is formed with a shallow trench isolation (STI) 212 which consists of a liner oxide layer 208 and a $SiO_x$ layer 210. Depending on the specific application, the substrate 200 may include a MOS transistor (not shown) which further comprises of a gate or a conductive region (not shown). A trench 216 is formed in the substrate 200, followed by formation of the liner oxide layer 208 by thermal oxidation. The $SiO_x$ layer 210 is then formed on the liner oxide layer 208 to fill the trench. The $SiO_x$ layer 210 may be formed by a conventional STI process. An edge recess 214 is consequently formed at a top corner of the STI 212 to expose a sidewall 218 of the substrate 200. The edge recess 214 is formed while performing an over etching step with the HF solution to remove a pad oxide (not shown) during the formation of the STI 212.

Referring to FIG. 2B, a first insulating layer 220 is formed to cover the STI 212 and to fill the edge recess 214. The first insulating layer 220 has a gap-filling capability and is formed preferably by chemical vapor deposition (CVD) using tetra-ethyl-ortho-siloxane (TEOS) as a source gas. The preferred material for the first insulating layer 220 is a $SiO_x$ layer. In addition, if a semiconductor device, such as a transistor, is formed on the substrate 200, another insulating layer, such as a liner oxide layer 208 may be formed to protect the semiconductor device.

Referring to FIG. 2C, an etching back step such as dry etching is performed to remove the first insulating layer 220 until the substrate 200 is exposed. The first insulating layer 220 that remains in the edge recess 214 after etching forms the first insulating layer 220a and planarizes the edge recess 214. Therefore, the edge recess problem is improved by filling the edge recess 214 with the first insulating layer 220a.

Second Embodiment

FIGS. 3A to 3D are schematic, cross-sectional views showing a subsequent salicide process according to the second embodiment of the present invention.

Figure 3A:
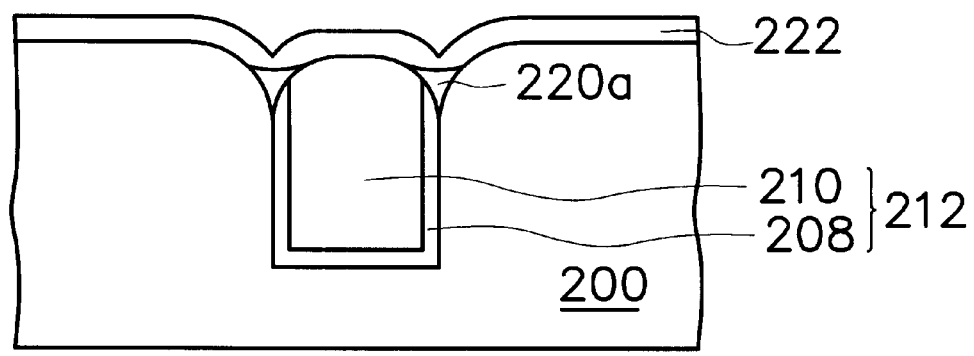
FIGS. 3A to 3D are schematic, cross-sectional views showing a subsequent salicide process according to the second embodiment of the present invention.

Referring to FIG. 3A, a thin second insulating layer 222 is formed to cover the STI 212, the first insulating layer 220a, and the substrate 200 described in the first embodiment as shown in FIG. 2D. The method for forming the second insulating layer 222 is preferably low pressure chemical vapor deposition (LPCVD) or sub-atmosphere pressure chemical vapor deposition (SACVD) using tetra-ethyl-ortho-siloxane (TEOS) as a source gas. The preferred material for the second insulating layer 222 comprises $SiO_x$, and the preferred thickness of the second insulating layer 222 is about 400 Å. Preferably, the second insulating layer 222 is thick enough to prevent penetration of metal ions during the following salicide process or metallization process.

Figure 3B:
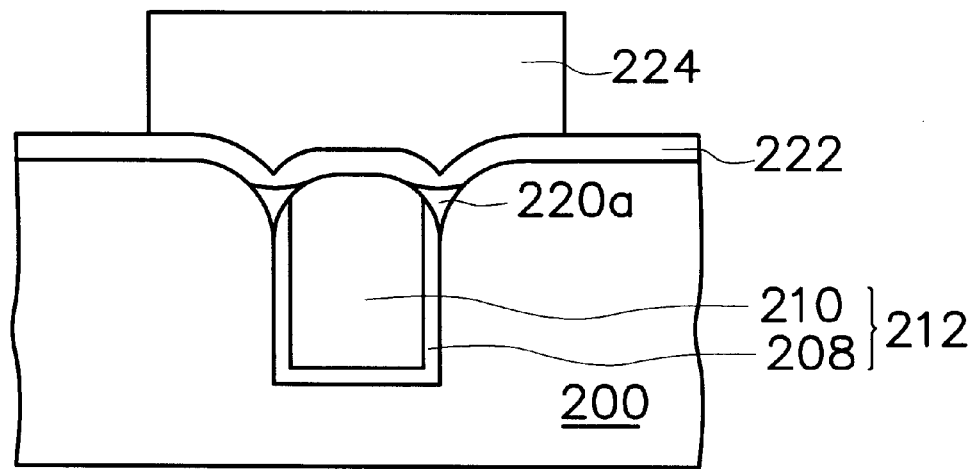

Referring to FIG. 3B, a photolithography process is performed on the second insulating layer 222. A photoresist layer 224 is then formed to cover a part of the second insulating layer 222 located above the STI 212, the first insulating layer 220a, and a part of the substrate 200.

Figure 3C:
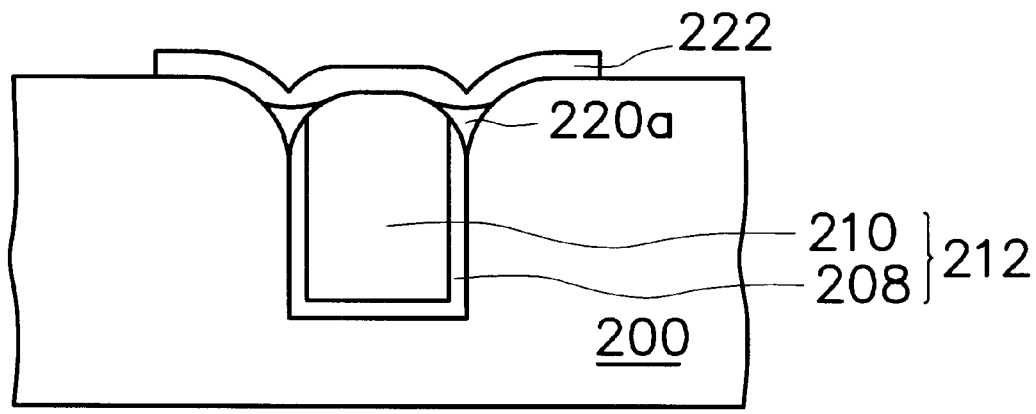

Referring to FIG. 3C, an anisotropic etching process is performed on the second insulating layer 222 using the photoresist layer 224 as a mask, until the surface of the substrate 200 is exposed. The photoresist layer 224 is then removed.

Figure 3D:
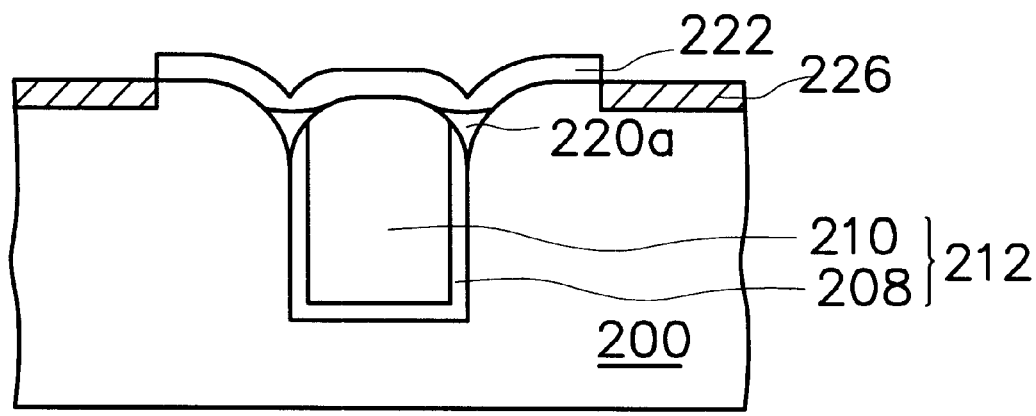

Referring to FIG. 3D, a salicide process is performed on the substrate 200 to form a metal salicide layer 226 on the substrate 200 and the gate of the MOS transistor (not shown). The metal salicide layer 226 is formed by forming a refractory metal layer, performing a thermal process to react the metal layer with a silicon layer located below the metal layer, and removing the metal layer not reacting with the silicon layer. The preferred metal layer is titanium (Ti). As the silicon layer is found on the substrate 200 or the gate of the MOS transistor (not shown), the metal salicide layer 226 is accordingly formed on the substrate 200 and the gate of the MOS transistor (not shown). Therefore, the salicide layer 226 does not appear in the edge recess 214, and the junction leakage problem by the edge recess 16 is eliminated.

While the invention has been described by way of example and in terms of preferred embodiment, it is to be understood that the invention is not limited thereto. To the contrary, it is intended to cover various modifications and similar arrangements and procedures and the scope of the appended claims therefore should be accorded the broadest interpretation so as to encompass all such modifications, similar arrangements and procedures.

What is claimed is:

1. A method to improve an edge recess problem of a shallow trench isolation (STI), the method comprising:

providing a substrate with a STI formed within, wherein a edge recess is formed at a top corner of the shallow trench isolation which exposes a sidewall of the substrate;

forming an insulating layer on the substrate to fill the edge recess; and planarizing the insulating layer until the substrate is exposed.

2. The method of claim 1, wherein the insulating layer includes a $SiN_x$ layer or a $SiO_x$ layer.

3. The method of claim 1, wherein the method for forming the insulating layer includes chemical vapor deposition.

4. The method of claim 1, wherein the insulating layer is planarized by wet etching.

5. A method to improve an edge recess problem of a shallow trench isolation (STI), the method comprising:

providing a substrate with the STI formed within, in which an edge recess is formed between the substrate and a top corner of the STI to expose a sidewall of the substrate;

forming an insulating layer which fills the edge recess and covers the sidewall of the substrate;

forming a patterned dielectric layer covering the insulating layer, the STI, and a part of the substrate, while another part of the substrate is exposed; and forming a salicide layer on the exposed substrate.

6. The method of claim 5, wherein the patterned dielectric layer is formed by the steps of:

forming a dielectric layer to cover the substrate, the STI, and the insulating layer; and performing a photolithography and etching step on the dielectric layer.

7. The method of claim 5, wherein the insulating layer includes a $SiN_x$ layer or a $SiO_x$ layer.

8. The method of claim 5, wherein the method for forming the insulating layer includes steps of:

forming an insulating layer on the substrate to fill the edge recess; and removing a part of the insulating layer on the substrate, so that the sidewall of the substrate is covered with a part of the insulating layer in the edge recess.

9. The method of claim 8, wherein the method for forming the insulating layer includes CVD.

10. The method of claim 8, wherein the insulating layer is removed by wet etching.

* * * * *